United States Patent
Xu et al.

(10) Patent No.: US 7,701,012 B2
(45) Date of Patent: Apr. 20, 2010

(54) COMPLEMENTARY ZENER TRIGGERED BIPOLAR ESD PROTECTION

(75) Inventors: Hongzhong Xu, Gilbert, AZ (US); Chai Ean Gill, Chandler, AZ (US); James D. Whitfield, Gilbert, AZ (US); Jinman Yang, Laveen, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 343 days.

(21) Appl. No.: 11/678,962

(22) Filed: Feb. 26, 2007

(65) Prior Publication Data

US 2008/0203534 A1 Aug. 28, 2008

(51) Int. Cl.
*H01L 23/62* (2006.01)

(52) U.S. Cl. .......................... 257/355; 361/56; 361/110; 361/111; 257/362; 257/363; 257/E29.169; 257/E29.184

(58) Field of Classification Search .................. 257/362, 257/363, E29.184, 355, E29.169, E29.173–E29.174, 257/E29.183; 361/56, 91.1, 110, 111
See application file for complete search history.

(56) References Cited

U.S. PATENT DOCUMENTS

| | | | |
|---|---|---|---|
| 4,367,509 A | 1/1983 | Snyder et al. | |
| 5,521,783 A * | 5/1996 | Wolfe et al. | 361/56 |
| 5,581,104 A * | 12/1996 | Lowrey et al. | 257/355 |
| 6,365,462 B2 | 4/2002 | Baliga | |
| 6,804,095 B2 | 10/2004 | Kunz et al. | |
| 7,164,566 B2 | 1/2007 | Xu et al. | |
| 2004/0095698 A1 | 5/2004 | Gerrish et al. | |
| 2005/0207077 A1 * | 9/2005 | Xu et al. | 361/56 |

OTHER PUBLICATIONS

Coffing, D., et al., Analysis of a Zener-Triggered Bipolar ESD Structure in a BiCMOS Technology, 0-7803-4497, IEEE 1998.

* cited by examiner

*Primary Examiner*—A. Sefer
*Assistant Examiner*—Ermias Woldegeorgis
(74) *Attorney, Agent, or Firm*—Ingrassia, Fisher & Lorenz, P.C.

(57) ABSTRACT

An electrostatic discharge (ESD) protection clamp (61) for I/O terminals (22, 23) of integrated circuits (ICs) (24) comprises an NPN bipolar transistor (25) coupled to an integrated Zener diode (30). Variations in the break-down current-voltage characteristics (311, 312, 313, 314) of multiple prior art ESD clamps (31) in different parts of the same IC chip is avoided by forming the anode (301) of the Zener (30) in the shape of a base-coupled P+ annular ring (75) surrounded by a spaced-apart N+ annular collector ring (70) for the cathode (302) of the Zener (30). Even though an angled implant (51, 86, 98) used to form the N+ annular collector ring (70) causes location dependent variations in the width (531, 532) of the Zener space charge (ZSC) region (691, 692), the improved annular shaped clamp (61) always has a portion that initiates break-down at the design voltage so that variations in the width (531, 532) of the ZSC region (691, 692) do not cause significant variations in the clamp's current-voltage characteristics (611, 612, 613, 614).

20 Claims, 6 Drawing Sheets

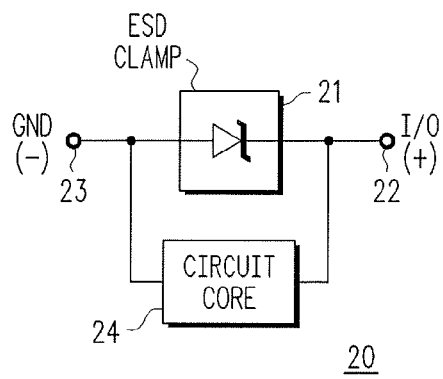
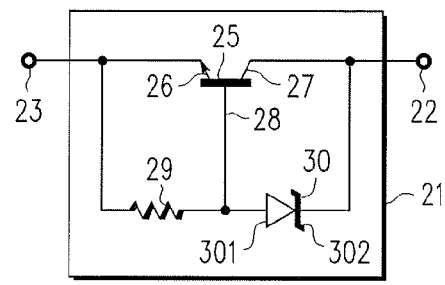
FIG. 1    FIG. 2
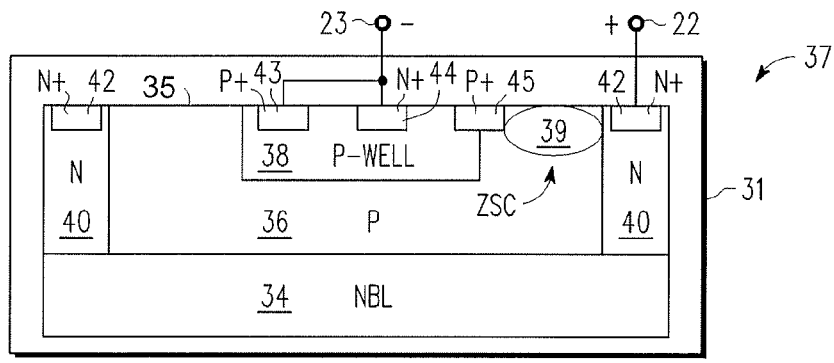
FIG. 3
-PRIOR ART-
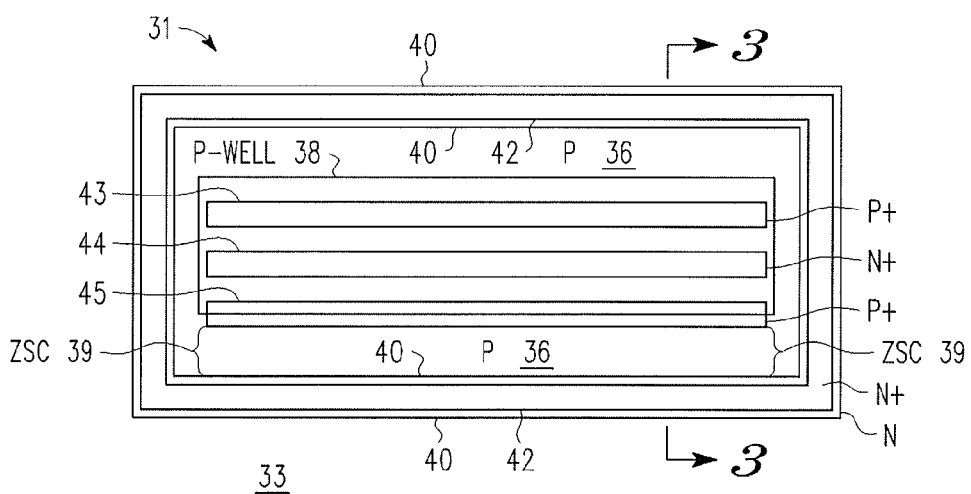
FIG. 4
-PRIOR ART-

US 7,701,012 B2

COMPLEMENTARY ZENER TRIGGERED BIPOLAR ESD PROTECTION

FIELD OF THE INVENTION

The present invention generally relates to semiconductor devices and methods for fabricating semiconductor devices, and more particularly relates to semiconductor devices used for electrostatic discharge (ESD) protection in integrated circuits.

BACKGROUND OF THE INVENTION

Modern integrated circuits (ICs) are at risk of damage due to electrostatic discharge (ESD) events. This is especially true of ICs that use field effect transistors (FETs), especially metal oxide semiconductor field effect transistors (MOSFETs), or simply MOS transistors or devices. Although the term "MOS" properly refers to a device having a metal gate electrode and an oxide gate insulator, that term is also used to refer to any semiconductor device that includes a conductive gate electrode (whether metal or not) that is positioned over a gate insulator (whether oxide or other dielectric material) which, in turn, is positioned over a semiconductor surface. Accordingly, the terms metal-oxide-semiconductor and the abbreviations "MOS" and "MOSFET" are used herein even though such devices may not employ just metals or oxides but combinations of conductive materials, e.g., alloys, silicides, doped semiconductors, etc., instead of simple metals, and insulating materials other than silicon oxides (e.g., nitrides, oxy-nitrides, other oxides, mixtures of dielectric materials, organic dielectrics, etc.). Thus, as used hereon the terms MOS and MOSFET are intended to include these and other variations.

A typical MOS transistor includes a gate as a control electrode and spaced-apart source and drain regions between which a current can flow. A control voltage applied to the gate adjusts the flow of current through a controllable conductive channel between the source and drain. Because the gate dielectric on most MOSFETS is relatively thin, it can be easily damaged if excess voltage appears on the gate terminal. It is well known that electrostatic discharge from handling MOS ICs is a source of such excess voltage. Accordingly, it is commonplace to provide an ESD clamp (voltage limiting device) across the input and/or other terminals of such MOSFETS and IC's employing MOSFETS. FIG. 1 is a simplified schematic diagram of circuit 20 wherein ESD clamp 21 is placed between input-output (I/O) terminal 22 and ground or common terminal 23 of an IC to protect other devices on the chip, that is, "circuit core" 24 coupled to the I/O and common terminals 22, 23. FIG. 2 is a simplified schematic diagram illustrating internal components of ESD clamp 21, utilizing bipolar transistor 25, having emitter 26, collector 27, base 28, resistance 29 and Zener diode 30 having terminals 301, 302. When the voltage across terminals 22, 23 rises beyond a predetermined limit, Zener diode 30 turns on, thereby switching bipolar transistor 25 into conduction and clamping the voltage across terminals 22, 23 at a level below that capable of damaging circuit core 24.

FIG. 3 shows simplified cross-sectional view 32 of ESD clamp 31 implementing ESD clamp 21 of FIGS. 1-2 in semiconductor substrate 37, according to the prior art. FIG. 4 shows simplified plan view 33 of ESD clamp 31 of FIG. 3. FIGS. 3 and 4 should be considered together. ESD clamp 31 comprises N-type buried layer (NBL) 34 above which lies P-type layer or region 36. P-well region 38 extends from surface 35 into P region 36. N-type sinkers 40 extend from surface 35 to make ohmic electrical contact to NBL 34. N+ regions 42 make ohmic contact to N-type sinkers 40. P+ regions 43 and 45 make ohmic contact to P-well 38. P-well 38 serves as the base of transistor 25 (see FIG. 2). N+ region 44 serves as the emitter of transistor 25. P+ region 45 serves as anode 301 of Zener diode 30 (see FIG. 2) whose cathode 302 is provided by N-type sinker 40 and N+ contact 42. Zener space charge region (abbreviated as "ZSC") 39 is located between P+ region 45, and N-sinker 40 with N+ contact 42. Anode terminal 22 of ESD clamp 31 is coupled to N+ region 42 and cathode terminal 23 of ESD clamp 31 is coupled to N+ region 44.

While such prior art devices are widely used as ESD clamps, they suffer from a number of limitations. Typical limitations are illustrated, for example, in FIG. 5. FIG. 5 shows plot 46 of the current (in milli-amps) between terminals 22, 23 of ESD clamp 31 as a function of the voltage (in volts) across terminals 22, 23 for nominally identical clamps, 311, 312, 313, 314, etc., (collectively 31) located in different regions and orientations of the same IC, and fabricated at the same time using the same mask set. ESD clamps 31 are intended to clamp the terminal voltage at about 10-12 volts. However, it is observed that some of the ESD clamps (e.g., ESD 311, 312) turn on at about 10-11 volts while others on the same chip (e.g., 314) do not turn on until the terminal voltage reaches 17-19 volts. This is observed even though ESD clamps 311, 312, 313, 314, etc., are manufactured at the same time using the same mask set on the same substrate, and would be expected to exhibit nearly identical properties no matter where they are located on the IC chip. This variability is undesirable since it exposes some I/O terminals and their associated circuit cores to significantly larger ESD voltages than other parts of the overall IC.

Accordingly, there is an ongoing need to provide improved ESD clamps, especially ESD clamps that operate at more consistent voltages independent of their location in a particular IC. Further, it is desirable that the improved ESD clamps be obtainable without significant modification of the manufacturing process used for forming the clamps and their associated circuit core of the IC. Furthermore, other desirable features and characteristics of the present invention will become apparent from the subsequent detailed description of the invention and the appended claims, taken in conjunction with the accompanying drawings and this background of the invention.

BRIEF DESCRIPTION OF THE DRAWINGS

The present invention will hereinafter be described in conjunction with the following drawing figures, wherein like numerals denote like elements, and wherein:

FIG. 1 is a simplified schematic diagram of a circuit wherein an ESD clamp is placed between an input-output (I/O) terminal and a ground or common terminal of an IC to protect other devices on the chip, that is, the "circuit core" coupled to the I/O terminals;

FIG. 2 is a simplified schematic diagram illustrating the internal components of an ESD clamp of FIG. 1;

FIG. 3 shows a simplified cross-sectional view of an ESD clamp implemented in a semiconductor substrate and suitable for use in the circuits of FIGS. 1-2, according to the prior art;

FIG. 4 shows a simplified plan view of the prior art ESD clamp of FIG. 3;

DETAILED DESCRIPTION OF THE INVENTION

Figure 5:
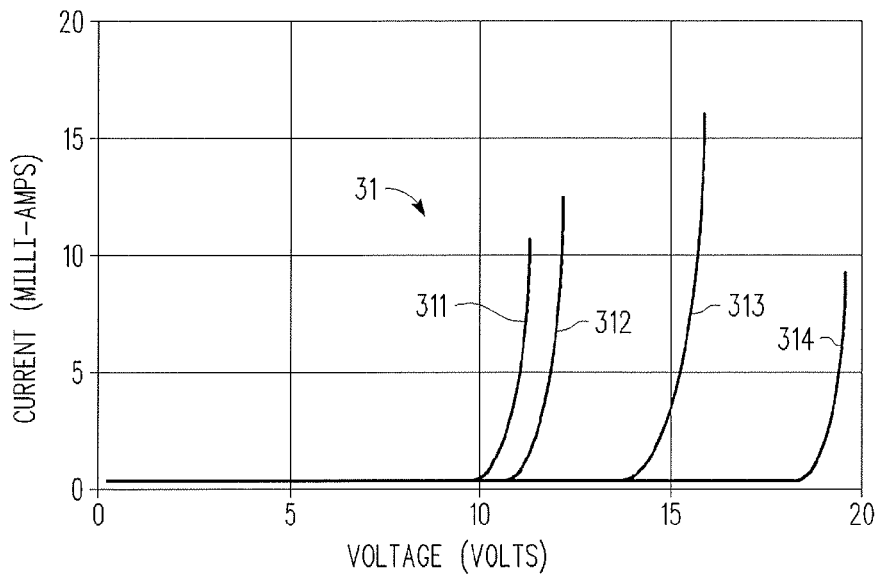
FIG. 5 is a plot of the terminal current of the ESD clamp of FIGS. 3-4 as a function of the terminal voltage for nominally identical ESD clamps located in different regions of the same semiconductor die and manufactured at the same time using the same mask set, according to the prior art.

The following detailed description is merely exemplary in nature and is not intended to limit the invention or the application and uses of the invention. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus.

The terms "left," "right," "in," "out," "front," "back," "up," "down," "top," "bottom," "over," "under," "above," "below" and the like in the description and the claims, if any, are used for descriptive purposes and not necessarily for describing permanent relative positions. It is to be understood that the terms so used are interchangeable under appropriate circumstances such that embodiments of the invention described herein are, for example, capable of operation in other orientations than those illustrated or otherwise described herein. The term "coupled," as used herein, is defined as directly or indirectly connected in an electrical or non-electrical manner.

Figures 6, 7:
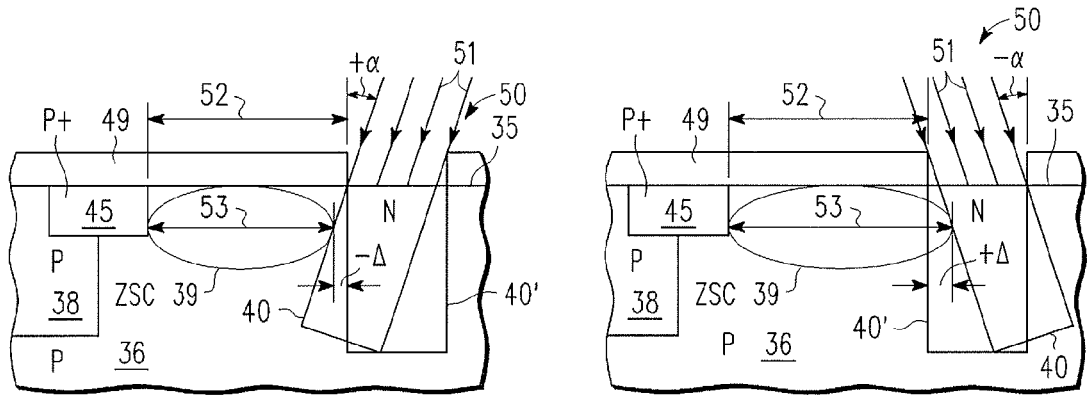
FIGS. 6 and 7 are simplified schematic cross-sections of the right hand portion of FIG. 3, somewhat enlarged, illustrating how the turn-on voltage variability of FIG. 5 can arise as a consequence of a manufacturing process being used.

FIGS. 6 and 7 are simplified schematic cross-sectional views 47, 48 of the right hand portion of FIG. 3, somewhat enlarged, illustrating schematically how the turn-on voltage variability of FIG. 5 can arise as a consequence of a manufacturing process being used. In the manufacturing stage being illustrated in FIGS. 6-7, mask 49 having opening 50 has been placed on surface 35 of P-region 36 for the purpose of forming N-type sinker 40 of FIG. 3. N-type sinker 40 is formed through opening 50 by ion implant 51. If ion implant 51 is performed at angle $\alpha$ with respect to the normal to surface 35, then the width of ZSC 39 will be affected by the magnitude of angle $\alpha$. For example, if $\alpha=0$ so that implant 51 is normal to surface 35, then N-type sinker 40' directly underlies opening 50 and ZSC region 39 would have width 53 approximately equal to distance 52 between where P+ region 45 will be located and the mask edge for N-type sinker 40'. However, if $0<|\alpha|<90$ degrees, then width 53 of ZSC region 39 will depend upon whether $\alpha$ is positive or negative. (In FIGS. 6 and 7, angle $\alpha$ is exaggerated so that the effect of variations in angle $\alpha$ may be more clearly seen.) If $\alpha$ is positive as shown in FIG. 6, then N-type sinker region 40 is tilted toward P+ region 45 within P region 36, effectively shortening width 53 of ZSC region 39 by amount $\Delta$, that is width 53=distance 52−$\Delta$. Conversely, if $\alpha$ is negative as shown in FIG. 7, then N-type sinker region 40 is tilted away from P+ region 45 within P region 36, effectively lengthening width 53 of ZSC region 39 by amount $\Delta$, that is width 53=distance 52+$\Delta$. When implantation 51 is performed, angle $\alpha$ is the same for the semiconductor wafer as a whole. However, the relative orientation of the combination of mask openings 50 and adjacent P+ region 45 can vary depending upon the location within a particular die of the wafer. Thus, some ESD clamp structures may be oriented with respect to ion implant 51 as shown in FIG. 6 and others may be oriented as shown in FIG. 7. As a consequence, ESD clamps in different parts of the die (and wafer) can have different ZSC region widths 53, even though they are manufactured simultaneously using the same mask set. The trigger or break-down voltage of ESD clamp 32 depends critically on ZSC width 53, thereby accounting for the differences in break-down voltage observed in FIG. 5.

Figure 8:
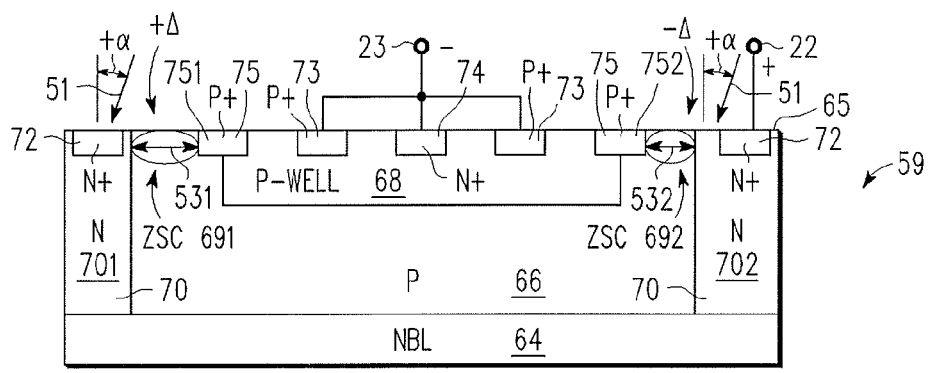
FIG. 8 shows a simplified cross-sectional view through an ESD clamp implemented in a semiconductor substrate and suitable for use in the circuits of FIGS. 1-2, but according to an embodiment of the invention.
Figure 9:
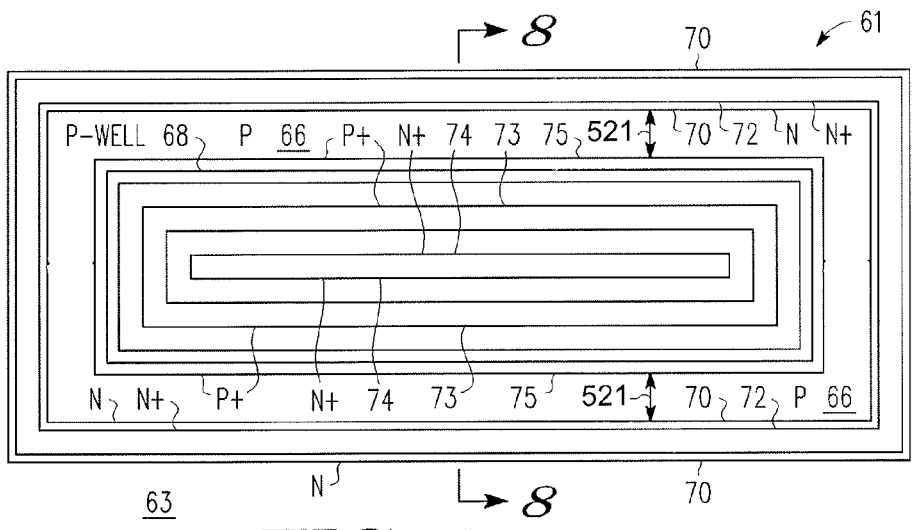
FIG. 9 shows a simplified plan view according to a further embodiment of the invention of the ESD clamp of FIG. 8.

FIG. 8 shows a simplified cross-sectional view through ESD clamp 61 implemented in semiconductor substrate 59 and suitable for use in the circuits of FIGS. 1-2, according to an embodiment of the invention. ESD clamp 61 comprises N-type buried layer (NBL) 64 on which is formed P-type region or layer 66 extending to surface 65. N-type sinkers 70 are provided extending from surface 65 to NBL 64. FIG. 9 shows simplified plan view 63, according to a further embodiment, of ESD clamp 61 of FIG. 8. FIGS. 8 and 9 should be considered together. P-well 68 is formed in P region 66, extending from surface 65. N+ regions 72 are provided in ohmic contact with N-type sinkers 70. P+ regions 73 and 75 are provided in ohmic contact with P-well 68. N+ region 74 in P-well 68 acts as the emitter of bipolar transistor 25 (see FIG. 2), P-well 68 forms the base of bipolar transistor 25 and NBL 64 (and N-type sinkers 70) act as the collector of bipolar transistor 25 (see FIG. 2). P+ region 75 acts as anode 301 and N-type sinker 70 with N+ contact 72 acts as cathode 302 of Zener diode 30 (see FIG. 2).

In the illustration of FIG. 8, $\alpha$ is positive (for example and not intended to be limiting, about +7 degrees). Therefore, at the left of FIG. 8, N-type sinker 701 will be effectively left-shifted away from P+ region 751 and corresponding ZSC region 691 will be wider by amount +$\Delta$. Correspondingly, at the right of FIG. 8, N-type sinker 702 will be effectively left-shifted toward P+ region 752 and corresponding ZSC region 692 will be shorter by amount −Δ. By reference to FIG. 9, it will be noted that P+ region 75 has the shape of an annular ring, rather than the stripe shape of corresponding P+ region 45 of FIG. 4. To avoid unduly cluttering the drawings, the slight angle associated with N-type sinkers 40 illustrated in FIGS. 6 and 7 are ignored for sinkers 70 in FIG. 8 and the effect illustrated by effectively left shifting sinkers 701 and 702 in FIG. 8. Similarly, the slight asymmetric shift in the location of N-type sinker regions 70 on different sides of device 61 is ignored in FIG. 9. It will be observed that device 61 of FIGS. 8-9 will always have at least one side where ZSC region has width 532=width 521 (of FIG. 9) −Δ. If α is positive, this will correspond to shortened distance 532 at the right hand side depicted in FIG. 8. Correspondingly, elongated width 531 at the left hand side of FIG. 8 will correspond to width 521+Δ. If α is negative, then the locations of elongated and shortened distances 531, 532 will be reversed. The side of ESD clamp 61 that has ZSC region 692 with width 532=width 521 (of FIG. 9) −Δ will always break down first; thereby ensuring that ESD clamp 61 comes into operation at a consistent voltage. It does not matter that the opposite side of the device where width 531=width 521+Δ is not yet active. Thus, ESD clamp 61 will not be subject to the large orientation dependent variations in break-down voltage observed with prior art ESD clamp 31 since the initial break-down voltage of ESD clamp 61 is orientation and location independent. This result is demonstrated in FIG. 10.

Figure 10:
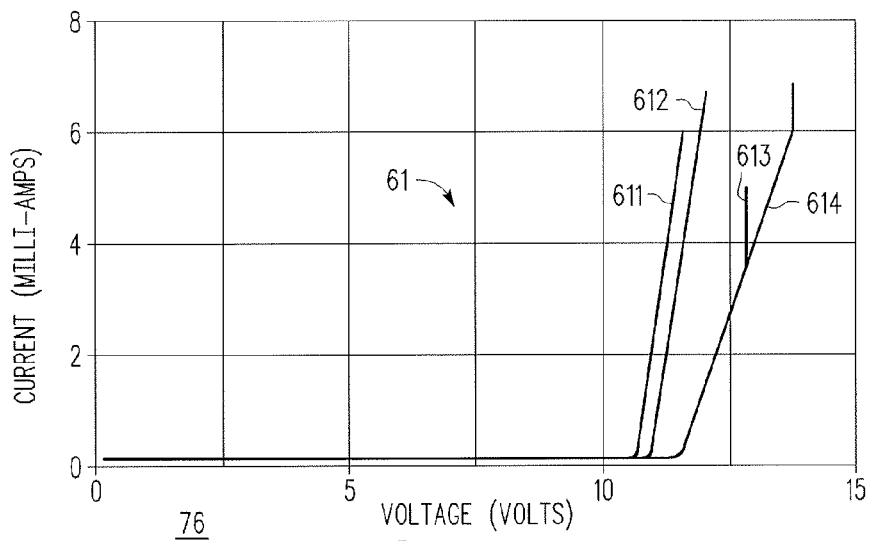
FIG. 10 is a plot of the terminal current of the ESD clamp of FIGS. 8-9 as a function of the terminal voltage for nominally identical ESD clamps located in different regions of the same semiconductor die and manufactured at the same time using the same mask set, according to embodiments of the invention.

FIG. 10 shows plot 76 of the terminal current (in milliamps) of ESD clamp 61 of FIGS. 8-9 as a function of the terminal voltage (in volts) for nominally identical ESD clamps 611, 612, 613, 614 (collectively 61) located in different portions of the same semiconductor die and manufactured at the same time using the same mask set, according to embodiments of the invention. The scales on FIGS. 5 and 10 are different to more clearly illustrate the improved behavior of ESD clamp 61 compared to prior art ESD clamp 31. Traces 611, 612, 613, 614 correspond to ESD clamps 61 positioned in substantially the same relative locations as ESD clamps 311, 312, 313, 314 respectively, of FIG. 5. It will be noted that ESD clamps 611, 612, 613, 614 show break-down voltages in the range of about 11-12 volts, substantially less than the range of about 11-19 volts observed for prior art ESD clamp 31 of FIGS. 3-4. This is a significant improvement in performance. It should also be noted, that this improvement is accomplished by means of a mask change and additional process steps are not required.

FIGS. 11-17 illustrate schematically, in cross-sectional view, method stages 100-106 in accordance with still further embodiments of the invention for fabricating ESD clamps of the type illustrated in FIG. 8-9, adapted to be interconnected according to circuit 20 of FIG. 1 and circuit 21 of FIG. 2. For convenience of description, method stages 100-106 are described for an NPN device, but this is not intended to be limiting. The more general terms "first conductivity type" and "second opposite conductivity type" may be used in place of the "P" or "N" type descriptions or labels herein, where it is understood that the term "first conductivity type" can refer to either P or N type doping and the term "second, opposite, conductivity type" therefore refers to the corresponding N or P (i.e., the opposite) type doping. For example, if a first region is identified as being of a first conductivity type, it can be either P or N type, and a second, opposite, conductivity type region would then be N or P type, respectively. Structures 110-116 result from manufacturing stages 100-106 respectively. Well known details of the various manufacturing stages are omitted. For example and not intended to be limiting, in some manufacturing stages, the mask(s) needed to define various regions of the devices, for etching and/or doping are mentioned but not shown in the figures and only the results or such etching and/or doping steps using such masks are illustrated. Persons of skill in the art of manufacturing semiconductor devices will understand how to provide such masks based on the results shown. While manufacturing stages 100-106 of FIGS. 11-17 illustrate formation of ESD clamp 61 of FIGS. 8-9, it will be understood by those of skill in the art that multiple ESD clamps for different I/O ports 22, 23 or other locations in or around the associated circuit cores are desirably formed at the same time.

Figure 11:
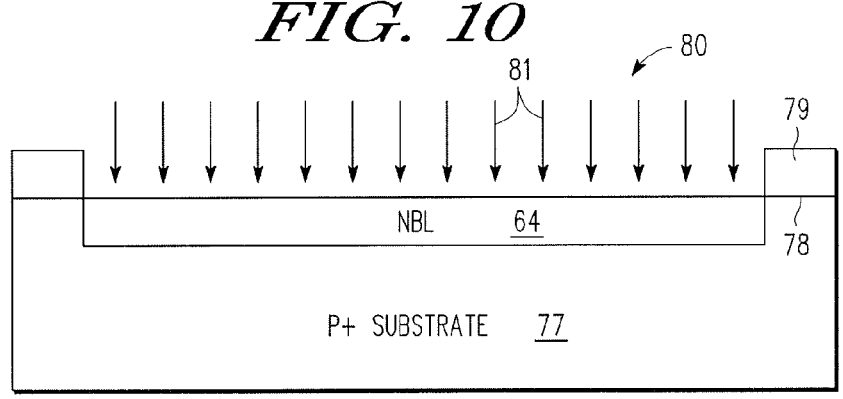
FIGS. 11-17 are simplified schematic cross-sectional views through a semiconductor wafer at different stages of manufacture of the ESD clamp of FIGS. 8-9, according to still further embodiments of the invention and showing further details.

Referring now to manufacturing stage 100 of FIG. 11, substrate 77 having upper surface 78 is conveniently provided. Substrate 77 may be a single crystal or polycrystalline material and may be a monolithic substrate or a layered substrate or merely a portion of such a substrate, and may be insulating or semiconducting. For example and not intended to be limiting, "substrate" 77 may be a P+ wafer or a P-type well or region formed in a substrate containing other semiconductor or insulating regions or may be a P-type layer on a semiconductor-on-insulator (SOI) structure, or may be an insulator. Accordingly, the term "substrate" is intended to include these and other variations. For reasons unconnected with the invention, substrate 77 is preferably a P+ material and is so identified in FIGS. 11-17 but this is merely for convenience of explanation of a preferred embodiment and not intended to be limiting. When a P+ material is used for substrate 77, its dopant concentration is usefully in the range of about 1E17 to 1E20 $cm^{-3}$, more conveniently about 5E17 to 5E19 $cm^{-3}$, and preferably about 1 E18 to 5E19 $cm^{-3}$. Mask 79 is provided on surface 78 of substrate 77 with opening 80 through which doping (e.g., ion implant) 81 is provided to form N-type buried layer (NBL) 64 (see also FIGS. 8-9). Doping levels of about 5E17 to 5E18 $cm^{-3}$ are convenient for NBL 64. While ion implantation is preferred any convenient means of providing NBL 64 may be employed. Structure 110 results.

Figure 12:
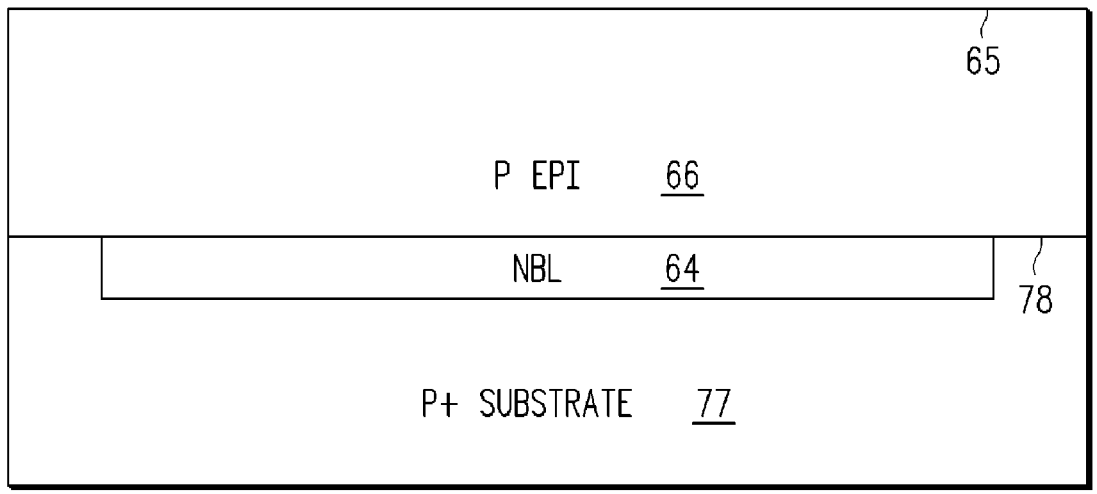

In manufacturing stage 101 of FIG. 12, P-type epi layer 66 with upper surface 65 is grown or otherwise formed over NBL 64 on surface 78 of substrate 77. P-type layer 66 should have a dopant concentration usefully in the range of about 1E13 to 1E17 $cm^{-3}$, more conveniently about 1E14 to 1E16 $cm^{-3}$, and preferably about 5E14 to 1E16 $cm^{-3}$ and thickness 67 (see FIG. 13) usefully in the range of about 2 to 8 micro-meters, more conveniently about 3 to 5 micro-meters and preferable about 3 to 4 micro-meters, but larger or smaller thicknesses can also be used depending upon the desired properties for ESD clamp 61. While formation of region or layer 66 by epitaxial growth is preferred, any means of providing region or layer 66 over NBL 64 may be used and the invention is not limited to the use of epitaxial growth for providing region or layer 66. Hence the identification of region or layer 66 as "P EPI" in FIGS. 12-17 is merely to illustrate a preferred embodiment and not intended to be limiting. Structure 111 results.

Figure 13:
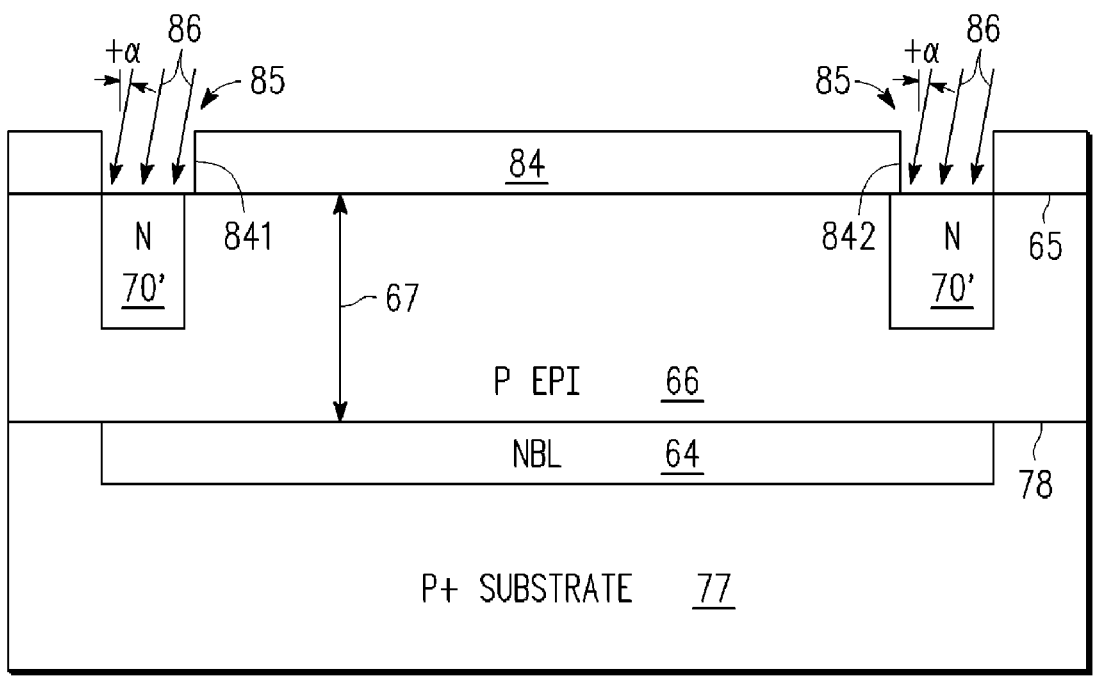

In manufacturing stage 102 of FIG. 13, mask 84 is formed or otherwise provided on surface 65 of P-type layer 66, with openings 85 corresponding to the location desired for N-type sinkers 70 of device 61. Angled ion implant 86 is performed at angle α through openings 85 to form N-type regions 70' in P-type layer 66. For convenience of description, α is assumed to be positive in FIG. 13 (and FIG. 16) but this is not essential. Angled ion implant 86 is used for forming N region 70' because it is available in the overall fabrication process for creating other elements of circuit core 24 at the same time. While the problem of ESD clamp break-down voltage variability illustrated in FIG. 5 could be avoided by performing the implant for forming N-type sinkers 70, 70' at α=0, this would require adding a further manufacturing step, which is not desirable. It is more economical and therefore more desirable to make use of manufacturing steps already employed for other portions of the IC of which ESD clamp 61 is a part. Implant angle α is usefully in the range 0<α<90 degrees, more conveniently in the range of about 0<α≦10 degrees and preferably about 7 degrees. Phosphorus ions are suitable for implant 86 to provide a dopant density usefully in the range of about 1E18 to 5E19 cm$^{-3}$, more conveniently about 1E18 to 1E19 cm$^{-3}$. The energy of implant 86 is such that N-type sinker 70' does not reach NBL 64, but this is not essential. Structure 112 results.

Figure 14:
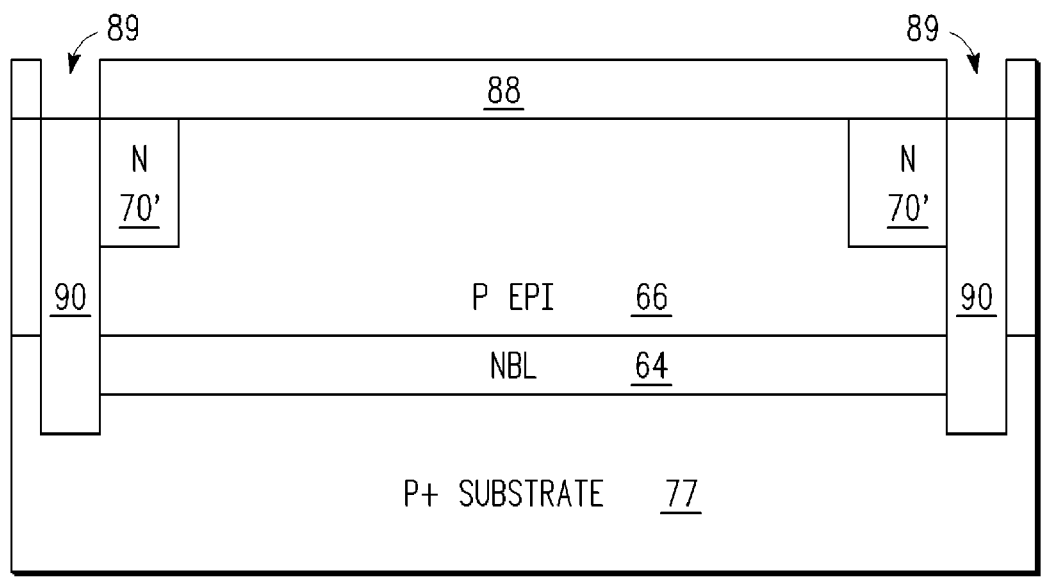

In manufacturing stage 103 of FIG. 14, structure 112 is covered by mask 88 having openings 89 through which dielectric trench isolation regions 90 are formed, e.g., by etch and dielectric refill. It is desirable that isolation regions 90 extend below NBL 64. Such steps are well known in the art. Structure 113 results.

Figure 15:
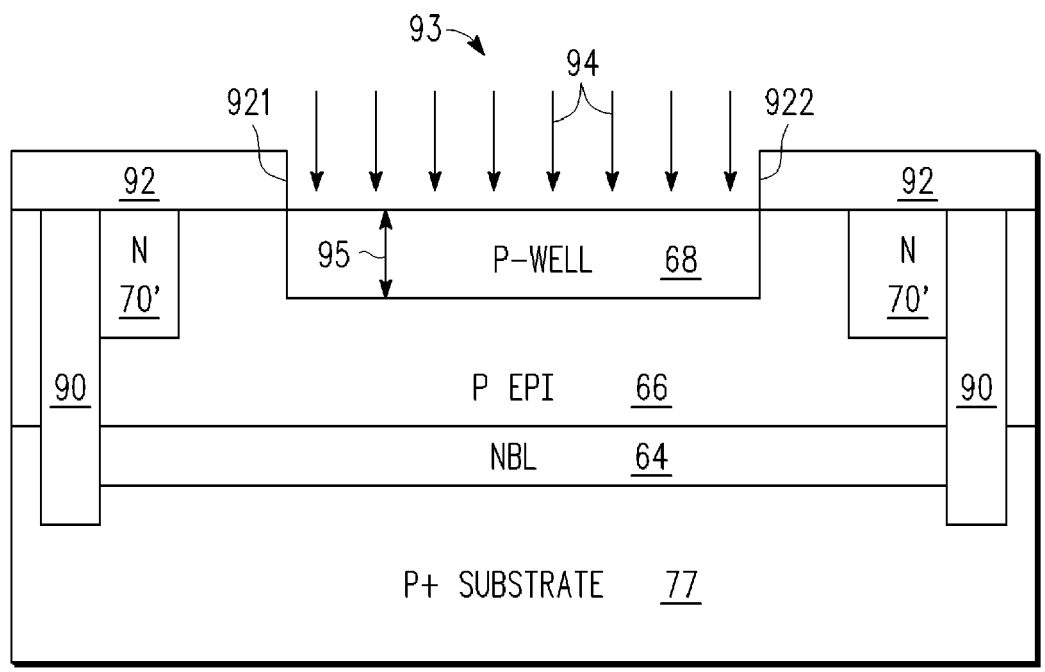

In manufacturing stage 104 of FIG. 15, mask 88 is removed and mask 92 provided having opening 93 of a size and location corresponding to the desired size and location of P-well 68. Implant 94 of for example, boron ions, is performed at an energy suitable to provide P-well 68 extending into P-type layer 66 to depth 95 usefully in the range of about 0.5 to 3.0 micro-meters, more conveniently about 0.5 to 2.5 micrometers and preferable about 1.0 to 2.0 micrometers with doping density usefully in the range of about $10^1$ to $10^2$ more heavily doped than region or layer 66. The relative locations of mask edges 921, 922 of manufacturing stage 104 of FIG. 15 and mask edges 841, 842 of manufacturing stage 103 of FIG. 13, determine 52 distances 521, 531, 532 of FIGS. 6-7 and 9. The magnitude of angle |α|>0 of the implant steps in manufacturing stages 102 of FIGS. 13 and 105 of FIG. 16 will determine the magnitude of Δ by which actual widths 531, 532 of SCZ regions 691, 692 (see FIG. 8) differ from an ideal width that would be obtained for α=0. Structure 114 results from manufacturing stage 104.

Figure 16:
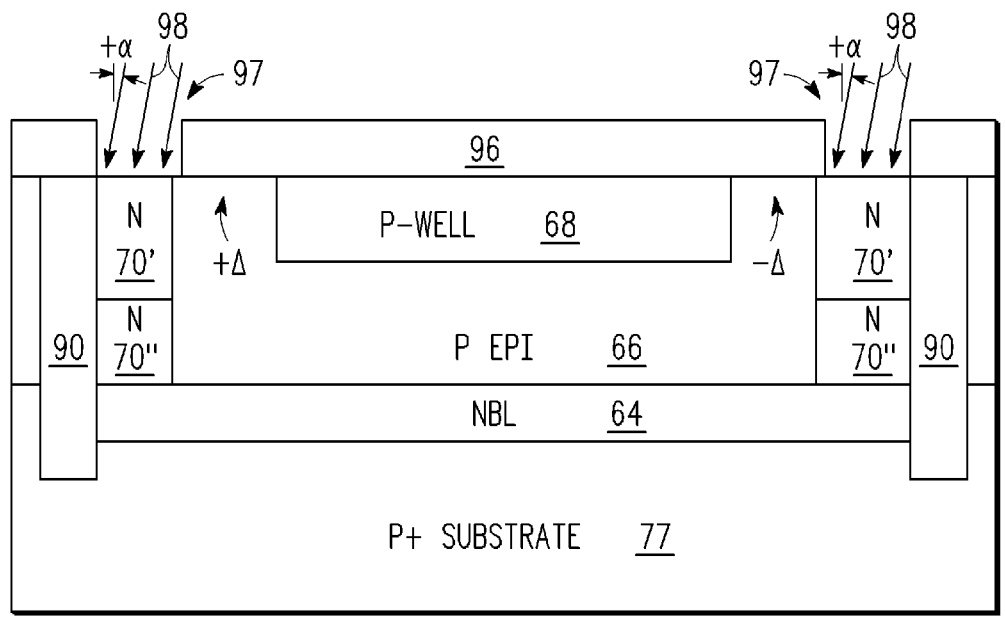

In manufacturing stage 105 of FIG. 16, mask 92 is removed and replaced with mask 96 having openings 97 located substantially above N regions 70' formed during manufacturing stage 102 of FIG. 13. Angled ion implant 98 is performed at angle α through openings 97 at energy sufficient to provide N sinker regions 70" extending from regions 70' to NBL 64. It is desirable to use the same angle as in manufacturing stage 102 of FIG. 13. N sinker regions 70" are desirably doped to an impurity concentration (doping density) intermediate between that of region 70' and NBL 64, but higher or lower doping densities can also be used. Again, it is convenient to form N-type sinkers 70 of FIGS. 8-9 from the combination of shallow implant sinkers 70' formed in manufacturing stage 102 and deep implant sinkers 70" formed in manufacturing stage 105 because of the availability of such shallow and deep implant steps in the manufacturing process needed for forming the circuit core elements that ESD 61 is intended to protect, but this is not essential and N-type sinkers 70 (referring collectively to the combination of regions 70' and 70"; see FIGS. 16-17) may be formed in a single doping step or a combination of doping steps. Structure 115 results.

Figure 17:
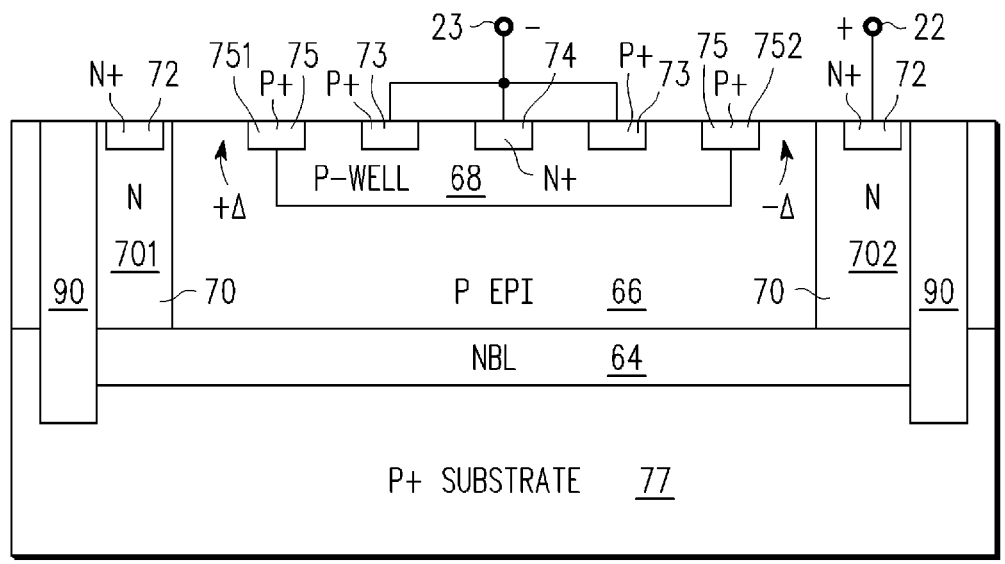

In manufacturing stage 106 of FIG. 17, highly doped contact regions are provided by appropriate masking and implant steps, familiar in the art. N+ region 72 is provided in ohmic contact with N-type sinker regions 70 (the combination of regions 70' and 70") and N+ region 74 is provided in P-well 68. These N+ regions are desirably but not essentially formed at the same time. Similarly, P+ regions 73 and 75 are desirably formed at the same time in P-well 68 at the relative locations shown. Persons of skill in the art will understand that separate masks (not shown) are used for forming the N+ and P+ regions. Conductive electrodes are then provided so that N+ region 74 is coupled to P+ regions 73 and to terminal 23, and N+ regions 72 are coupled to terminal 22. It will be understood by reference to FIG. 9, that P+ regions 73, 75 are annular in shape. In this way, left side P+ region 751 and right side P+ region 752 are coupled. Similarly, N+ regions 72 are annular in shape, so that both left-side N-type sinker 701 and right-side sinker 702 are coupled to terminal 22. Structure 116 results.

According to a first embodiment of the invention, there is provided an electrostatic discharge (ESD) protection clamp having first and second protective terminals adapted to limit a voltage appearing across protected terminals of an integrated circuit (IC) to which the protective terminals are coupled, comprising, a bipolar transistor having an emitter of a first conductivity type coupled to the first protective terminal, a collector of the first conductivity type coupled to the second protective terminal and a base of a second, opposite conductivity type located between the emitter and collector, an integrated Zener diode having a first Zener terminal of the second conductivity type ohmically coupled to the base and a second Zener terminal of the first conductivity type ohmically coupled to the collector, wherein, the first Zener terminal has a substantially annular ring shape at a periphery of the base, and the second Zener terminal has a substantially annular ring shape spaced apart from the first Zener terminal. In a further embodiment, the first Zener terminal is more heavily doped than the base. In a still further embodiment, the second Zener terminal is spaced apart from the first Zener terminal by a further region of the second conductivity type. In a yet further embodiment, the further region is less heavily doped than the base. In a still yet further embodiment, the clamp comprises a buried layer of the first conductivity type, underlying the base and coupled to the second Zener terminal. In a yet still further embodiment, the second Zener terminal is adapted to also function as a collector terminal. In an additional embodiment, the clamp further comprises a substantially annular shaped sinker region of the first conductivity type making ohmic contact to the buried layer and to the second protective terminal. In a still additional embodiment, the sinker region is formed by ion implantation at an angle α of magnitude greater than zero degrees with respect to a normal to a principal surface of the ESD clamp. In a yet additional embodiment, the angle α is of magnitude in the range of 0<α<90 degrees with respect to the normal to the principal surface. In a still yet additional embodiment, the angle α is of magnitude about 7 degrees.

According to a second embodiment there is provided a process for forming an ESD clamp adapted for use in protecting terminals of a semiconductor integrated circuit (IC) from excess voltage, comprising, providing a supporting substrate having a first surface, forming a semiconductor buried layer of a first conductivity type in or on the first surface, forming a semiconductor layer of a second, opposite, conductivity type overlying the buried layer and having an outer surface, angle implanting an annular shaped sinker region of the first conductivity type extending to the buried layer, the annular shaped sinker region being adapted to form a first terminal of an integrated Zener diode, providing a dielectric isolation region laterally outside the annular sinker region, forming a well region of the second conductivity type in the semiconductor layer, extending to the first surface, lying laterally within and spaced apart from the annular shaped sinker region, forming an emitter region of the first conductivity type in the well region, forming an annular shaped ohmic contact region of the second conductivity type in the well region, substantially laterally surrounding the emitter region, forming a substantially annular shaped further region of the second conductivity type and more highly doped than the well region, ohmically coupled to a periphery of the well region, and lying laterally within and spaced apart from the annular shaped sinker region, wherein the annular shaped further region is adapted to form a second terminal of the integrated Zener diode, electrically coupling the emitter region and the annular shaped ohmic contact region to each other and to a first terminal of the ESD clamp, and electrically coupling the annular shaped sinker region to a second terminal of the ESD clamp. According to a further embodiment, the step of angle implanting an annular shaped sinker region comprises, implanting at an angle $\alpha$ with respect to a normal to the outer surface of magnitude in the range of $0<\alpha<90$ degrees. In a still further embodiment, the angle $\alpha$ is of magnitude in the range of about $0<\alpha<10$ degrees. In a yet further embodiment, the angle $\alpha$ is of magnitude about 7 degrees. In a still yet further embodiment, the steps of forming an emitter region and forming an annular shaped ohmic contact region, comprises forming a substantially stripe-shaped emitter region substantially centrally located within the annular shaped ohmic contact region. In a yet still further embodiment, the process further comprises, electrically coupling the first and second terminals of the ESD clamp to further semiconductor devices intended to be protected by the ESD clamp.

According to a third embodiment there is provided an ESD clamp, comprising, a bipolar transistor having an emitter region, a collector region and a base region, an integrated Zener comprising a first terminal and second terminal, the first terminal integral with a part of the base region and the second terminal integral with a part of the collector region, wherein the second terminal has an annular shape laterally surrounding and spaced apart from the base region, and wherein the first terminal has an annular shape lying laterally within and laterally separated from the second terminal and laterally surrounding and ohmically coupled to the base region. According to a further embodiment, an annular shaped space of predetermined width separates the first and second terminals of the Zener, and wherein the predetermined width has a first value on one side of the bipolar transistor and a second value on an opposite side of the bipolar transistor. According to a still further embodiment, the second terminal is formed by ion implantation at a directional angle $\alpha$ where $0<|\alpha|<90$ degrees with respect to a normal to an outer surface of the bipolar transistor. According to a yet further embodiment, an annular shaped space separates the first and second terminals of the Zener and a width of the annular shaped space varies azimuthally depending upon its azimuthal orientation relative to the directional angle of implantation.

While at least one exemplary embodiment and method of fabrication has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. An electrostatic discharge (ESD) protection clamp having a principal surface, and having first and second protective terminals adapted to limit a voltage appearing across protected terminals of an integrated circuit (IC) to which the protective terminals are coupled, comprising:

a bipolar transistor having an emitter of a first conductivity type coupled to the first protective terminal, a collector of the first conductivity type coupled to the second protective terminal and a base of a second, opposite conductivity type located between the emitter and collector, wherein the collector includes a first sinker region extending from the principal surface and a second sinker region extending from the principal surface;

an integrated Zener diode having a first Zener terminal of the second conductivity type at the principal surface and ohmically coupled to the base, and a second Zener terminal of the first conductivity type at the principal surface and ohmically coupled to the collector;

wherein:
   the first Zener terminal has a substantially annular ring shape at a periphery of the base, wherein a first Zener space charge region having a first width is defined between a first portion of the first Zener terminal and the first sinker region, and a second Zener space charge region having a second width is defined between a second portion of the first Zener terminal and the second sinker region, wherein the first width and the second width differ by a distance that is a function an angle of ion implementation, $\alpha$, having a magnitude greater than zero degrees with respect to a normal to the principal surface; and
   the second Zener terminal has a substantially annular ring shape spaced apart from the first Zener terminal.

2. The ESD clamp of claim 1, wherein the first Zener terminal is more heavily doped than the base.

3. The ESD clamp of claim 1, wherein the second Zener terminal is spaced apart from the first Zener terminal by a further region of the second conductivity type.

4. The ESD clamp of claim 3, wherein the further region is less heavily doped than the base.

5. The ESD clamp of claim 1, further comprising a buried layer of the first conductivity type, underlying the base and coupled to the second Zener terminal.

6. The ESD Clamp of claim 5, wherein the second Zener terminal is adapted to also function as a collector terminal.

7. The ESD clamp of claim 5, wherein the first sinker region and the second sinker region form portions of a substantially annular shaped sinker region of the first conductivity type making ohmic contact to the buried layer and to the second protective terminal.

8. The ESD clamp of claim 7, wherein the sinker region is formed by ion implantation at the angle $\alpha$.

9. The ESD clamp of claim 8, wherein the angle $\alpha$ is of magnitude of less than 90 degrees with respect to the normal to the principal surface.

10. The ESD clamp of claim 1, wherein the angle $\alpha$ is of magnitude about 7 degrees.

11. An ESD clamp having a principal surface, comprising:
    a bipolar transistor having an emitter region, a collector region and a base region, wherein the collector region includes a first sinker region extending from the principal surface and a second sinker region extending from the principal surface;

an integrated Zener comprising a first terminal and a second terminal, the first terminal integral with a part of the base region and the second terminal integral with a part of the collector region;

wherein the second terminal has an annular shape laterally surrounding and spaced apart from the base region; and wherein the first terminal has an annular shape lying laterally within and laterally separated from the second terminal and laterally surrounding and ohmically coupled to the base region, wherein a first Zener space charge region having a first width is defined between a first portion of the first terminal and the first sinker region, and a second Zener space charge region having a second width is defined between a second portion of the first terminal and the second sinker region, wherein the first width and the second width differ by a distance that is a function an angle of ion implementation, $\alpha$, having a magnitude greater than zero degrees with respect to a normal to the principal surface.

12. The ESD clamp of claim 11, wherein $\alpha$ has a magnitude of less than 90 degrees with respect to the normal to the principal surface.

13. The ESD clamp of claim 12, wherein an annular shaped space separates the first and second terminals of the Zener and a width of the annular shaped space varies azimuthally depending upon its azimuthal orientation relative to the angle of ion implantation.

14. An electrostatic discharge (ESD) protection clamp comprising:
a supporting substrate having a first surface;
a semiconductor buried layer of a first conductivity type in or on the first surface;
a semiconductor layer of a second, opposite, conductivity type overlying the buried layer and having an outer surface;
an annular shaped, angularly implanted, sinker region of the first conductivity type extending to the buried layer, the annular shaped sinker region being adapted to form a first terminal of an integrated Zener diode and including a first sinker region extending from the first surface and a second sinker region extending from the first surface;
a dielectric isolation region laterally outside the annular sinker region;
a well region of the second conductivity type in the semiconductor layer, extending to the first surface, lying laterally within and spaced apart from the annular shaped sinker region;
an emitter region of the first conductivity type in the well region;
an annular shaped ohmic contact region of the second conductivity type in the well region, substantially laterally surrounding the emitter region; and
a substantially annular shaped further region of the second conductivity type and more highly doped than the well region, ohmically coupled to a periphery of the well region, and lying laterally within and spaced apart from the annular shaped sinker region, wherein the annular shaped further region is adapted to form a second terminal of the integrated Zener diode, wherein a first Zener space charge region having a first width is defined between a first portion of the further region and the first sinker region, and a second Zener space charge region having a second width is defined between a second portion of the further region and the second sinker region, wherein the first width and the second width differ by a distance that is a function an angle of ion implementation, $\alpha$, having a magnitude greater than zero degrees with respect to a normal to the first surface, wherein the emitter region and the annular shaped ohmic contact region are electrically coupled to each other and to a first terminal of the ESD clamp, and wherein the annular shaped sinker region is electrically coupled to a second terminal of the ESD clamp.

15. The ESD protection clamp of claim 14, wherein the annular shaped, angularly implanted, sinker region is angularly implanted at an angle $\alpha$ with respect to a normal to the outer surface of magnitude of less than 90 degrees.

16. The ESD protection clamp of claim 14, wherein the angle $\alpha$ is of a magnitude of less than 10 degrees.

17. The ESD protection clamp of claim 14, wherein the angle $\alpha$ is of a magnitude of about 7 degrees.

18. The ESD protection clamp of claim 14, wherein the emitter region comprises a substantially stripe-shaped emitter region substantially centrally located within the annular shaped ohmic contact region.

19. The ESD protection clamp of claim 14, wherein the first and second terminals of the ESD clamp are electrically coupled to further semiconductor devices intended to be protected by the ESD clamp.

20. The ESD protection clamp of claim 1, wherein the first width of the first Zener space charge region is wider than a third width by an amount $\Delta$, and the second width of the second Zener space charge region is shorter than the third width by the amount $\Delta$.

* * * * *